United States Patent
Lu et al.

(10) Patent No.: US 9,178,063 B2
(45) Date of Patent: Nov. 3, 2015

(54) SEMICONDUCTOR DEVICE (71) Applicant: TAIWAN SEMICONDUCTOR MANUFACTURING COMPANY, LTD., Hsinchu (TW)

(72) Inventors: Wei-Yuan Lu, Taipei (TW); Li-Ping Huang, Taipei (TW); Han-Ting Tsai, Kaohsiung (TW); Wei-Ching Wang, Taichung (TW); Ming-Shuan Li, Shudong Township (TW); Hsueh-Jen Yang, Taipei (TW); Kuan-Chung Chen, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/457,484

(22) Filed: Aug. 12, 2014

(65) Prior Publication Data
US 2014/0346614 A1    Nov. 27, 2014

Related U.S. Application Data (62) Division of application No. 13/356,207, filed on Jan. 23, 2012, now Pat. No. 8,828,817.

(51) Int. Cl.
| | |
|---|---|
| *H01L 29/76* | (2006.01) |
| *H01L 29/78* | (2006.01) |
| *H01L 21/265* | (2006.01) |
| *H01L 21/324* | (2006.01) |
| *B82Y 10/00* | (2011.01) |
| *H01L 29/32* | (2006.01) |
| *H01L 29/66* | (2006.01) |

(52) U.S. Cl.
CPC .............. *H01L 29/7849* (2013.01); *B82Y 10/00* (2013.01); *H01L 21/26506* (2013.01); *H01L 21/324* (2013.01); *H01L 29/32* (2013.01); *H01L 29/7843* (2013.01); *H01L 29/7848* (2013.01); *H01L 29/6653* (2013.01); *H01L 29/6656* (2013.01); *H01L 29/7613* (2013.01)

(58) Field of Classification Search
CPC .............. H01L 21/234; H01L 29/7848; H01L 29/66795; H01L 29/6656; H01L 2924/0002
USPC ............................ 257/288, 329, 409, E29.255
See application file for complete search history.

(56) References Cited

U.S. PATENT DOCUMENTS 8,193,049 B2 * 6/2012 Golonzka et al. ............. 438/199
8,343,825 B2   1/2013 Domenicucci et al.

(Continued)

OTHER PUBLICATIONS

Packan, P. et al., "High Performance 32nm Logic Technology Featuring 2nd Generation High-k + Metal Gate Transistors", IEEE 2009, pp. 28.4.1-28.4.4.

*Primary Examiner* — Andy Huynh
(74) *Attorney, Agent, or Firm* — Hauptman Ham, LLP (57) ABSTRACT

A semiconductor device includes a gate structure over a substrate, a source region in the substrate, where the source region is adjacent to the gate structure. Additionally, the semiconductor device includes a drain region in the substrate, where the drain region is adjacent to the gate structure. Moreover, the semiconductor device includes a first dislocation in the substrate between the source region and the drain region. Furthermore, the semiconductor device includes a second dislocation in the substrate between the source region and the drain region, where the second dislocation is substantially parallel to the first dislocation.

20 Claims, 10 Drawing Sheets

(56) References Cited

U.S. PATENT DOCUMENTS

| | | |
|---|---|---|
| 2010/0038685 A1 | 2/2010 | Weber et al. |
| 2010/0148270 A1* | 6/2010 | Golonzka et al. ............. 257/369 |
| 2013/0009216 A1 | 1/2013 | Tsai et al. |
| 2013/0037822 A1 | 2/2013 | Yin et al. |
| 2013/0099294 A1* | 4/2013 | Lu et al. ........................ 257/288 |
| 2013/0099314 A1 | 4/2013 | Lu et al. |

* cited by examiner

FIG. 8

SEMICONDUCTOR DEVICE

PRIORITY CLAIM

The present application is a divisional of U.S. application Ser. No. 13/356,207, filed Jan. 23, 2012, which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present application. It is understood, however, that the present application should not be limited to a particular type of device, except as specifically claimed.

With reference to FIGS. 1 and 2-10, a method 100 and a semiconductor device 200 are collectively described below. The semiconductor device 200 refers to an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 1:
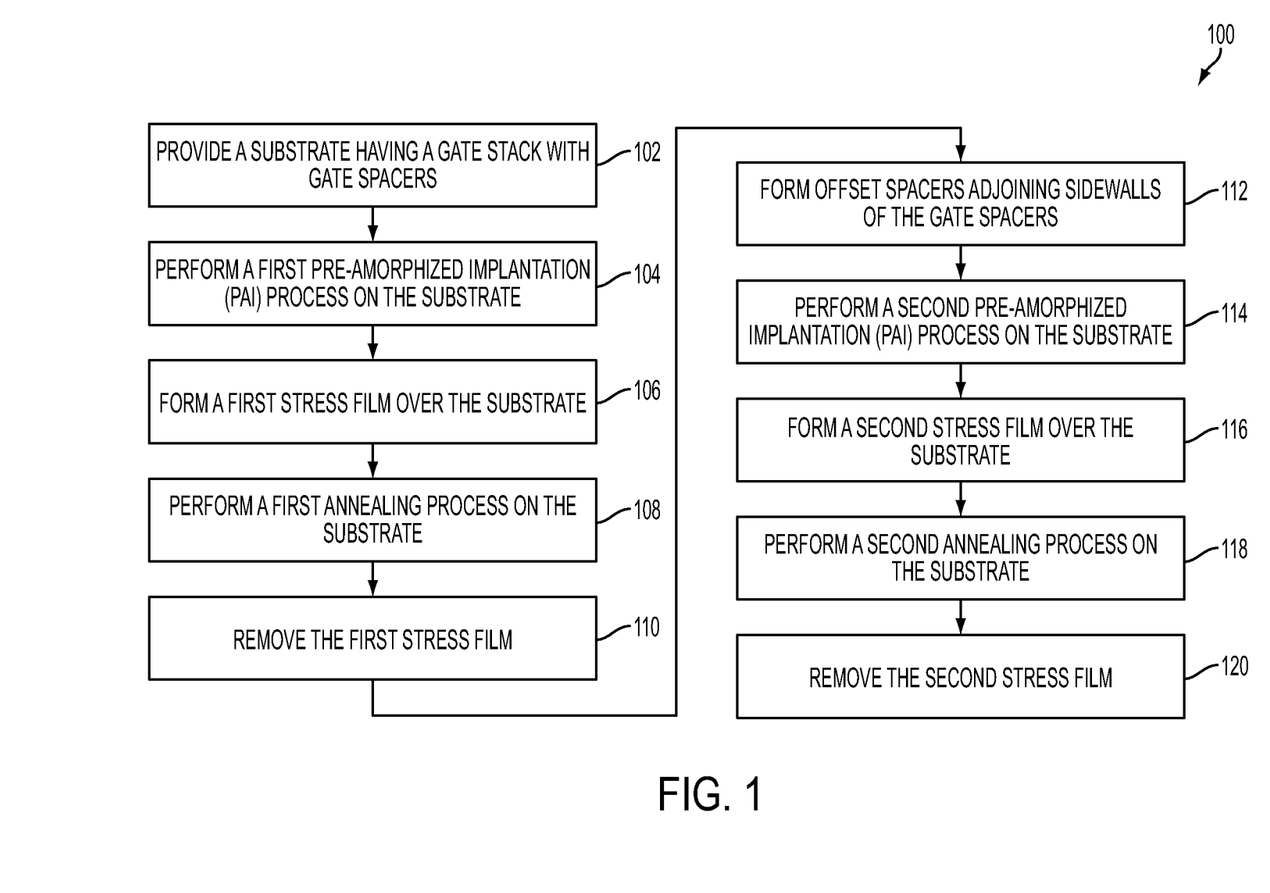
FIG. 1 is a flowchart illustrating a method of forming a semiconductor device according to various aspects of the present disclosure.

Referring to FIG. 1, a method 100 for fabricating a semiconductor device is described according to various aspects of the present disclosure. The method 100 begins with step 102 in which a substrate is provided. The substrate includes a gate stack and gate spacers. The method 100 continues with step 104 in which a first pre-amorphous implantation (PAI) process is performed on the substrate. The method 100 continues at step 106 in which a first stress film is deposited over the substrate. The method 100 continues at step 108 in which a first annealing process is performed on the substrate. The method 100 continues at step 110 in which the first stress film is removed. The method 100 continues at step 112 in which offset spacers are formed adjoining sidewalls of the gate spacers. The method 100 continues at step 114 in which a second pre-amorphous implantation (PAI) process is performed on the substrate. The method 100 continues at step 116 in which a second stress film is deposited over the substrate. The method 100 continues at step 118 in which a second annealing process is performed on the substrate. The method 100 continues at step 120 in which the second stress film is removed. The discussion that follows illustrates various embodiments of a semiconductor device 200 that can be fabricated according to the method 100 of FIG. 1.

Figure 2:
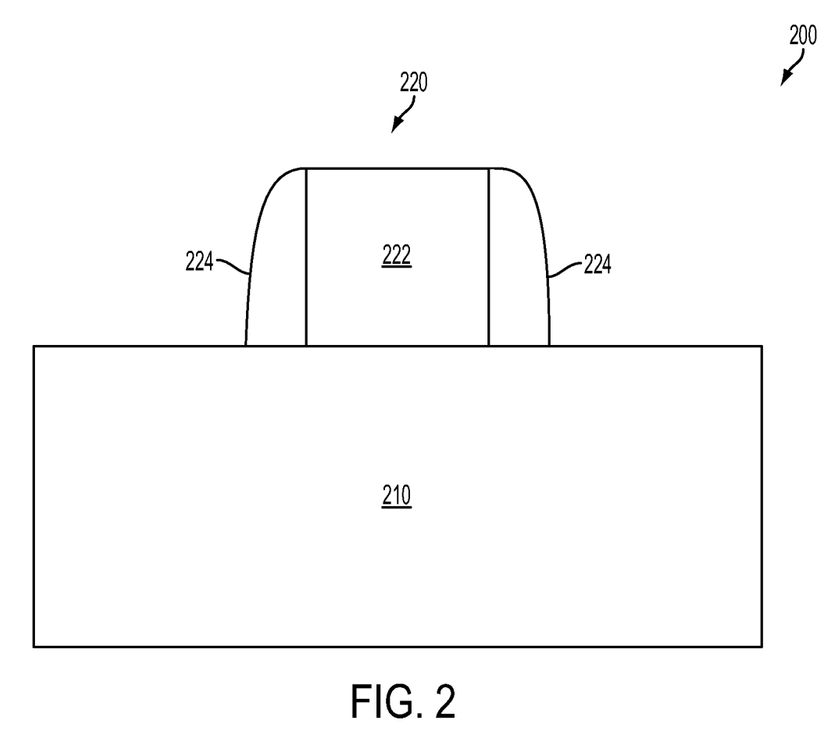
FIGS. 2 to 10 are cross-sectional side views of a semiconductor device at various stages of fabrication according to the method of FIG. 1 in accordance with one or more embodiments.

FIGS. 2 to 10 are cross-sectional side views of the semiconductor device 200 at various stages of fabrication according to the method 100 of FIG. 1. Referring to FIGS. 1 and 2, the method 100 begins at step 102, wherein a substrate 210 is provided. In the present embodiment, the substrate 210 is a semiconductor substrate including silicon. In some alternative embodiments, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative embodiment, the semiconductor substrate could be a semiconductor on insulator (SOI).

The substrate 210 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

The substrate 210 can include an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes a gate structure 220 disposed over the substrate 210, and the gate structure 220 defines a channel region of the substrate 210 thereunder. The substrate 210 may further include a source region and a drain region on both sides of the gate structure 220, the channel region being the region between the source region and the drain region. The gate structure 220 includes various gate material layers. In the present embodiment, the gate structure 220 includes a gate stack 222 (also referred to as a gate electrode) and gate spacers 224 disposed adjoining sidewalls of the gate stack 222.

The gate stack 222 is formed over the substrate 210 to a suitable thickness. In an example, the gate stack 222 is a polycrystalline silicon (or polysilicon) layer. The polysilicon layer may be doped for proper conductivity. In some alternative embodiments, the polysilicon is not necessarily doped, for example, if a dummy gate is to be formed and later replaced by a gate replacement process. In another example, the gate stack 222 includes a conductive layer having a proper work function. Therefore, the conductive layer of the gate stack 222 is sometimes referred to as a work function layer. The work function layer includes a suitable material, such that the layer can be tuned to have a proper work function for enhanced performance of the device. For example, if a P-type work function metal (P-metal) for a PMOS device is desired, TiN or TaN may be used. On the other hand, if an N-type work function metal (N-metal) for an NMOS device is desired, Ta, TiAl, TiAlN, or TaCN, may be used. The work function layer could include doped conducting oxide materials. The gate stack 222 could include other conductive materials, such as aluminum, copper, tungsten, metal alloys, metal silicide, other suitable materials, and/or combinations thereof. The gate stack 222 could include multiple layers. For example, where the gate stack 222 includes a work function layer, another conductive layer can be formed over the work function layer. The gate stack 222 is formed by chemical vapor deposition (CVD), physical vapor deposition (PVD), atomic layer deposition (ALD), high density plasma CVD (HD-PCVD), plating, other suitable methods, and/or combinations thereof.

In some embodiments, the gate spacers 224 include a single-layer or a multiple-layer structure. In the present embodiment, a blanket layer of spacer material (not shown) is formed over the substrate 210 and the gate stack 222 by a depositing process including CVD, PVD, ALD, or other suitable techniques. In some embodiments, the spacer material comprises silicon oxide, silicon nitride, silicon oxy-nitride, other suitable material, or combinations thereof. In some embodiments, the deposited layer of spacer material has a thickness ranging from about 5 nm to about 15 nm. Then, an anisotropic etching process is performed on the spacer material to form the gate spacers 224. The gate spacers 224 can be used to offset subsequently formed doped regions, such as heavily doped source/drain regions.

Figure 3:
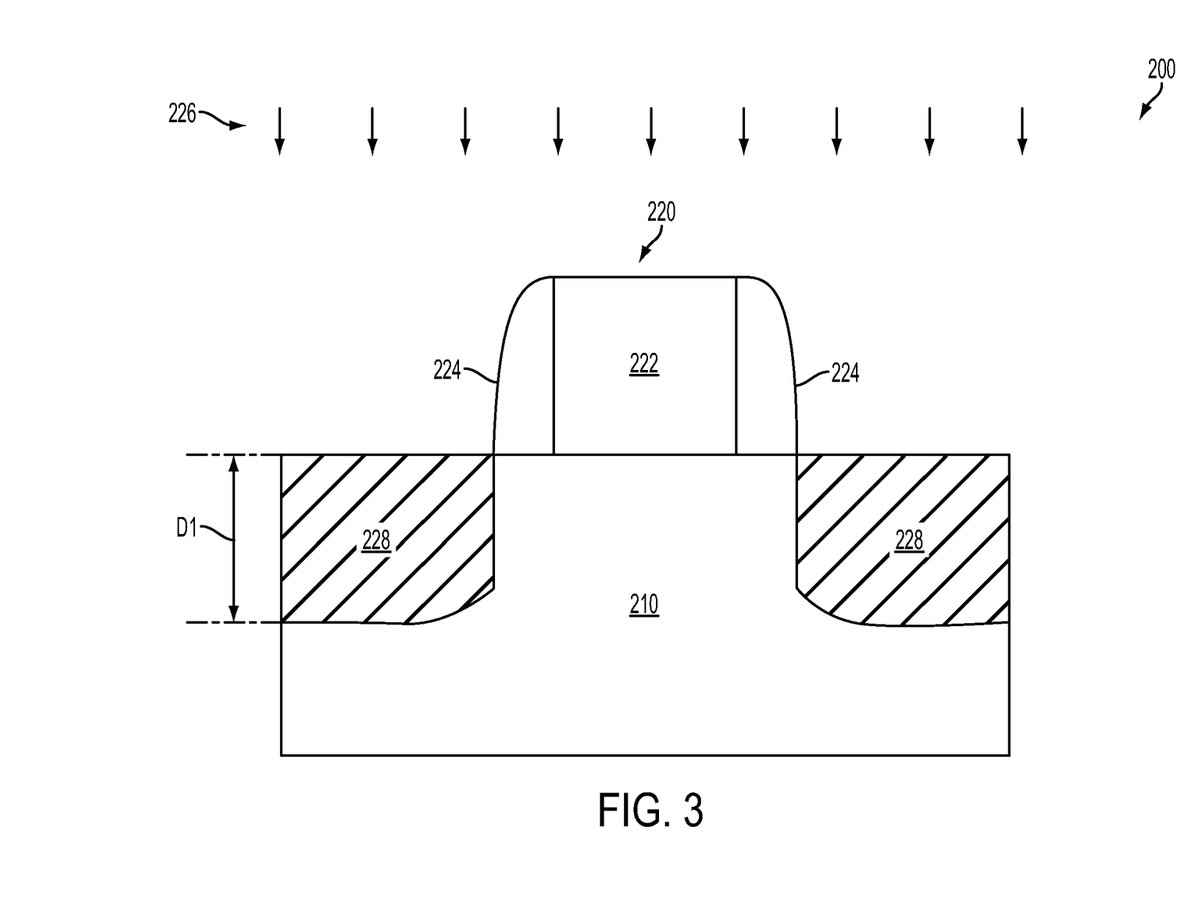

Referring to FIGS. 1 and 3, the method 100 proceeds to step 104, wherein a first pre-amorphous implantation (PAI) process 226 is performed on the substrate 210. The first PAI process 226 implants the substrate 210. The PAI process 226 causes damage to the lattice structure of the substrate 210 and forms first amorphized regions 228. In the present embodiment, the first amorphized regions 228 are formed in source and drain regions of the semiconductor device 200. The first amorphized regions 228 have a depth D1 (measured from an upper surface of the substrate 210). The depth D1 is formed according to design specifications. The depth D1, in some embodiments, ranges from about 10 nanometers to about 150 nanometers. In the present embodiment, the depth D1 is less than about 100 nanometers. The depth D1 can be controlled by the thickness of the gate spacers 224 because the gate spacers 224 serve to concentrate the first PAI process 226 implantation energy. Also, the depth D1 can be controlled by the first PAI process 226, such as implant energy, implant species, and/or implant dosage. In at least one embodiment, the first PAI process 226 implants the substrate 210 with silicon (Si) or germanium (Ge). In an alternative embodiment, the first PAI process 226 could utilize other implant species, such as Ar, Xe, C, $BF_2$, As, In, other suitable implant species, or combinations thereof. In the present embodiment, the first PAI process 226 implants Si or Ge at an implant energy ranging from about 15 KeV to about 50 KeV, and an implant dosage ranging from about $1 \times 10^{14}$ atoms/cm² to about $2 \times 10^{15}$ atoms/cm², depending on the implantation temperature. In at least one embodiment, the first PAI process 226 is performed at room temperature (e.g. 25° C.). In an alternative embodiment, the first PAI process 226 is performed at a low temperature (e.g., −60° C. to −100° C.) by adapting a Cryo (low temperature) function in the ion implanter to enhance the efficiency of implant amorphization. In some embodiments, the first PAI process 226 is performed with a tilt angle ranging from about 0 degree to about 20 degrees.

In some alternative embodiments, the first PAI process 226 can be a multiple-step implantation process, including at least a first step and a second step of the implantation process. The first and the second steps of the implantation process are performed using a first and a second implant energy levels, a first and a second implant dosages, and a first and a second implant tilt angles, respectively. In at least one embodiment, the first and the second implant energy levels range from about 15 KeV to about 50 KeV. In anther embodiment, the first implant energy level is greater than the second implant energy level. In at least one embodiment, the first and the second implant dosages range from about $1 \times 10^{14}$ atoms/cm² to about $2 \times 10^{15}$ atoms/cm². In anther embodiment, the first implant dosage is greater than the second implant dosage. In some embodiments, a combined dosage of the first and the second implant dosages range from about $1\times10^{14}$ atoms/cm$^2$ to about $2\times10^{15}$ atoms/cm$^2$, and a ratio between the first and the second implant dosages ranges from about 1:1 to about 7:3. In one embodiment, the first and the second tilt angles range from about 0 degree to about 20 degrees. In anther embodiment, the first implant tilt angle is greater than the second implant tilt angle.

A patterned photoresist layer (not shown) may be utilized to define where the first amorphized regions 228 are formed and protect other regions of the semiconductor device 200 from implantation damage. For example, the patterned photoresist layer exposes the source/drain regions, such that the source/drain regions are exposed to the first PAI process 226 (forming the first amorphized regions 228) while the gate structure 220 (and other portions of the semiconductor device 200) are protected from the first PAI process 226. In some alternative embodiments, a patterned hard mask layer (not shown), such as a SiN or SiON layer, is utilized to define areas for forming the first amorphized regions 228. The patterned photoresist layer or the patterned hard mask layer may be part of the current manufacturing process (e.g., LDD or source/drain formation), thereby minimizing cost as no additional photoresist layer or hard mask is required for the first PAI process 226.

Figure 4:
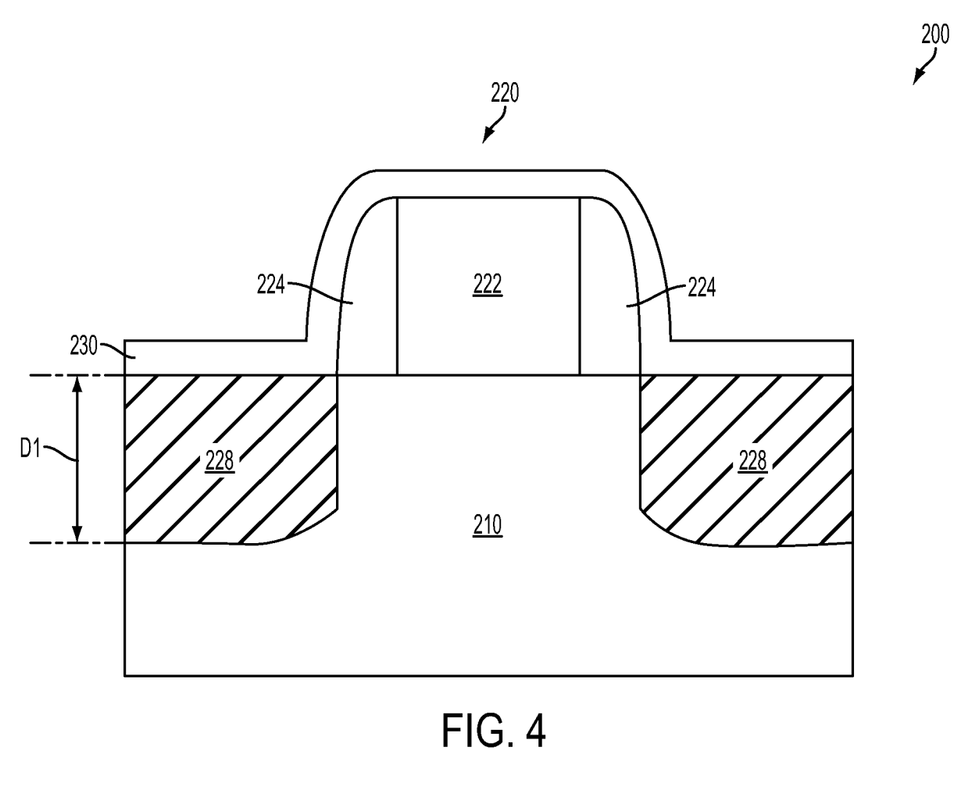

Referring to FIGS. 1 and 4, the method 100 proceeds to step 106 wherein a first stress film 230 is deposited over the substrate 210. The first stress film 230 may be formed by chemical vapor deposition (CVD), physical vapor deposition (PVD), atomic layer deposition (ALD), high density plasma CVD (HDPCVD), plating, other suitable methods, and/or combinations thereof. The first stress film 230 may include a dielectric material, such as silicon nitride, silicon oxide, silicon oxynitride, other suitable materials, and/or combinations thereof. In some embodiments, the first stress film 230 is used to provide tensile stress in a subsequent first annealing process 232 which recrystallizes the first amorphized regions 228.

Figure 5:
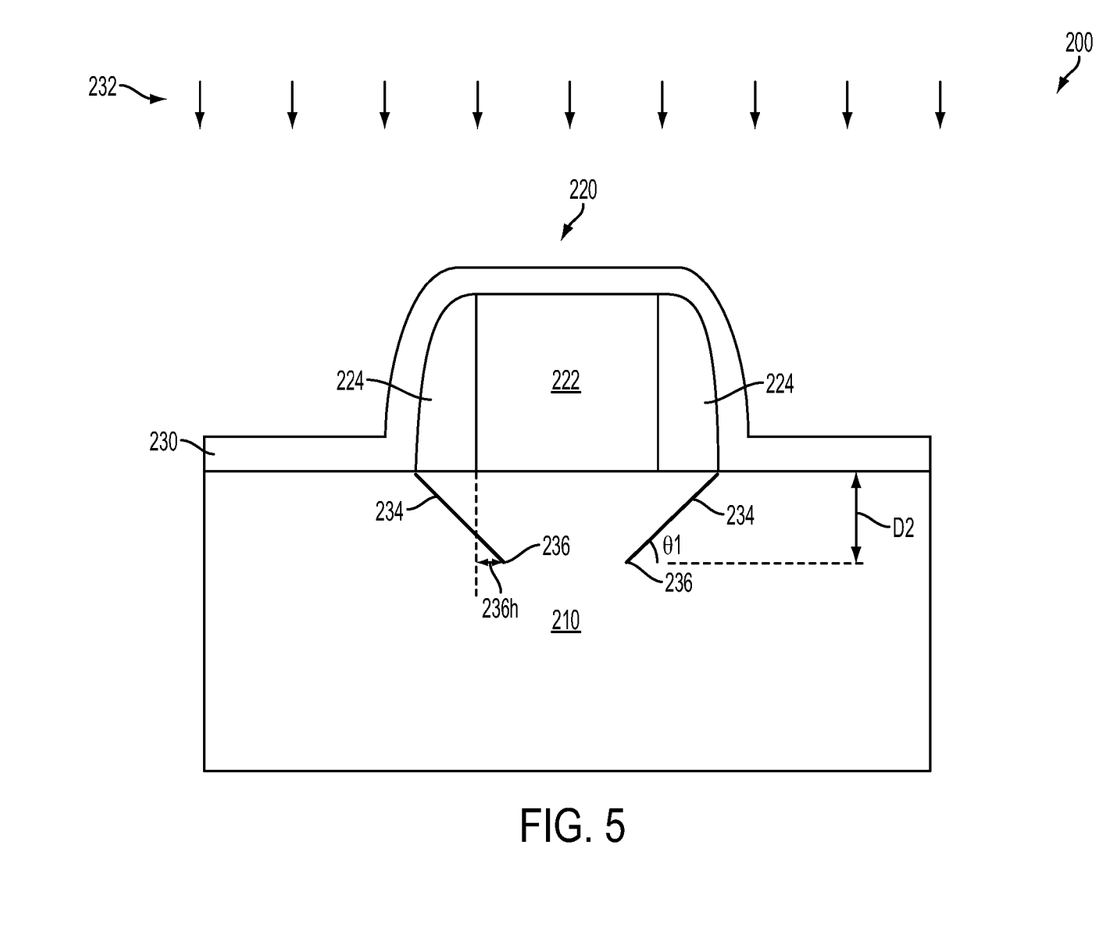

Referring to FIGS. 1 and 5, the method 100 proceeds to step 108 wherein a first annealing process 232 is performed on the substrate 210. In some embodiments, the first annealing process 232 is a rapid thermal annealing (RTA) process, spike RTA process, or a millisecond thermal annealing (MSA) process (e.g., millisecond laser thermal annealing process). In at least one embodiment, the first annealing process 232 includes a RTA process performed at a temperature ranging from about 600° C. to about 750° C., lasting for a period of time ranging from about 10 seconds to about 5 minutes. In an alternative embodiment, the first annealing process 232 includes a spike RTA process performed at a temperature ranging from about 990° C. to about 1050° C., lasting for a period of time ranging from about 0.1 seconds to about 2 seconds. In some alternative embodiment, the first annealing process 232 may further include a pre-heat step to minimize (or even eliminate) the end of range (EOR) defects. In some embodiments, the pre-heat step may be performed at a temperature ranging from about 400° C. to about 700° C. In some embodiments, the pre-heat step may be performed for a period of time ranging from about 10 seconds to about 5 minutes. In the present embodiment, the pre-heat step is performed at a temperature of about 550° C. lasting for about 30 seconds.

During the first annealing process 232, as the first amorphized regions 228 being re-crystallized, first dislocations 234 of the re-crystallized counterpart of the amorphized regions 228 are formed in the substrate 210. In some embodiments, the substrate 210 is referred to as a (100) substrate and the first dislocations 234 are formed along a <111> direction. In some embodiments, the <111> direction has an angle Al, measured with respect to a reference level parallel to a surface of the substrate 210, ranging from about 45 to about 65 degrees. In the present embodiment, the first dislocations 234 have <111> direction with the angle θ1 of about 55 degrees. The first dislocations 234 are formed starting at first pinchoff points 236. The first pinchoff points 236 have a depth D2 measured from the upper surface of the substrate 210. In some embodiments, the depth D2 of the first pinchoff points 236 ranges from about 10 nanometers to about 150 nanometers. In the present embodiment, the depth D2 of the first pinchoff points 236 ranges from about 10 nanometers to about 30 nanometers. The first pinchoff points 236 have a horizontal buffer (proximity) 236h measured from an adjacent gate edge of the gate stack 222. The horizontal buffer 236h and the depth D2 are formed according to design specifications and are a function of the first annealing process 232. In some embodiments, the horizontal buffer 236h of the first pinchoff points 236 ranges from about −5 nanometers to about 10 nanometers ("−" represents the first pinchoff points 236 are under the gate stack 222.). The first pinchoff points 236 may be formed such that they are not disposed within the channel region in the substrate 210 defined by the gate stack 222.

Figure 6:
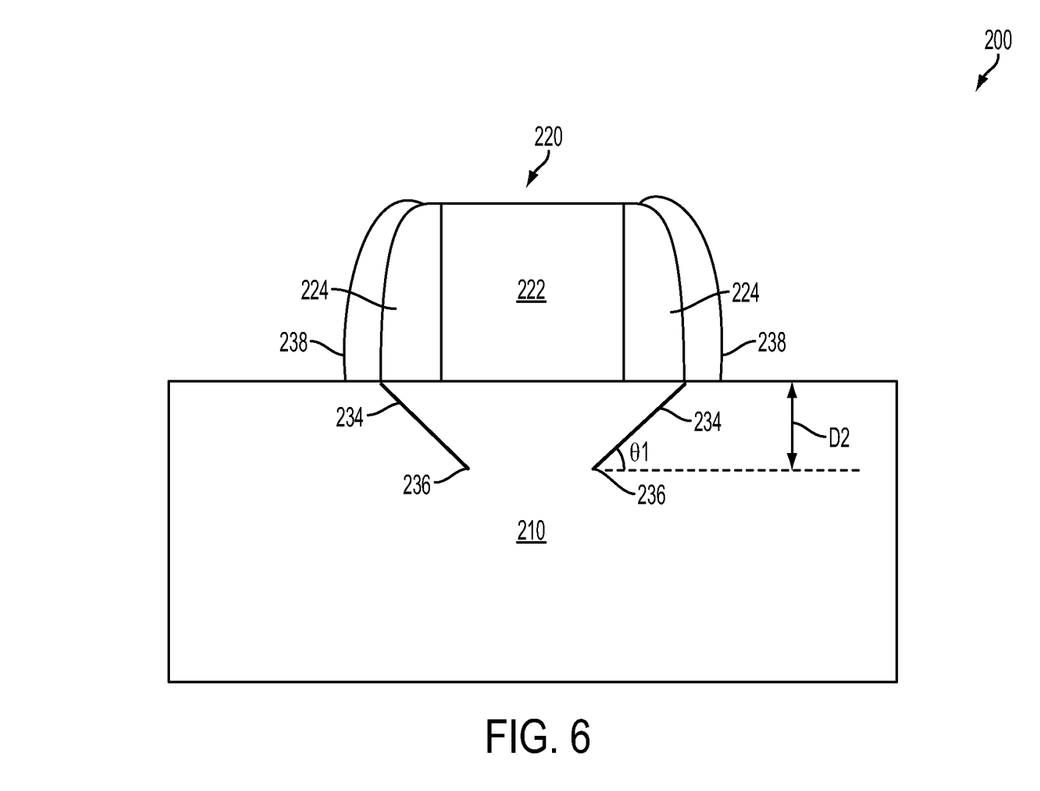

Referring to FIGS. 1 and 6, the method 100 proceeds to step 110 wherein the first stress film 230 is removed from the substrate 210. The first stress film 230 is removed, for example, by a wet etching using phosphoric acid or hydrofluoric acid, or by a dry etching using suitable etchant. Still referring to FIG. 6, the method 100 proceeds to step 112 wherein offset spacers 238 are formed adjoining an outer sidewall surface of each of the gate spacers 224. In the present embodiment, a blanket layer of spacer material (not shown) is formed over the substrate 210, the gate spacers 224, and the gate stack 222 by a depositing process including CVD, PVD, ALD, or other suitable techniques. In some embodiments, the spacer material comprises silicon oxide, silicon nitride, silicon oxynitride, other suitable material, or combinations thereof. In some embodiments, the spacer material comprises a material different from the material of the gate spacers 224. In some embodiments, the layer of material for forming the offset spacers 238 has a thickness ranging from about 5 nanometers to about 15 nanometers. Then, an anisotropic etching process is performed on the spacer material to form the offset spacers 238.

Figure 7:
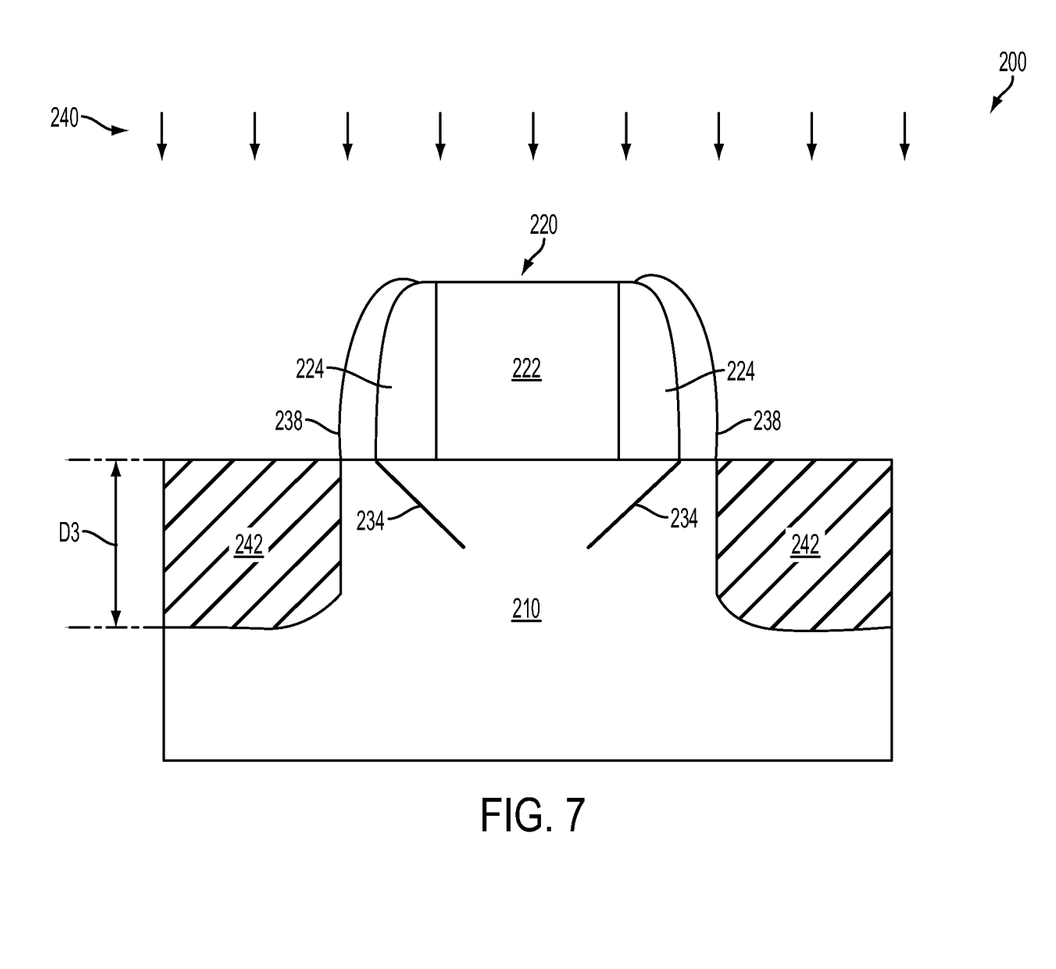

Referring to FIGS. 1 and 7, the method 100 proceeds to step 114 wherein a second pre-amorphous implantation (PAI) process 240 is performed on the substrate 210. The second PAI process 240 implants the substrate 210, damaging the lattice structure of the substrate 210, and forming second amorphized regions 242. In the present embodiment, the second amorphized regions 242 are formed in the source and drain regions of the semiconductor device 200 and have an offset distance from the first amorphized regions 228 defined by the offset spacers 238, thereby preventing the first dislocations 234 from being partially or completely eliminated during the second PAI process 240 and/or subsequent processes.

The second amorphized regions 242 have a depth D3 (measured from the upper surface of the substrate 210) formed according to design specifications. In some embodiments, the depth D3 ranges from about 10 nanometers to about 150 nanometers. In the present embodiment, the depth D3 is less than about 50 nanometers. In the present embodiment, the depth D3 is substantially the same as the depth D1 of the first amorphized regions 228. The depth D3 can be controlled by the second PAI process 240, such as implant energy, implant species, and/or implant dosage. The second PAI process 240 implants the substrate 210 with silicon (Si) and/or germanium (Ge). Alternatively, the second PAI process 240 could utilize other implant species, such as Ar, Xe, $BF_2$, As, In, other suitable implant species, or combinations thereof. In the present embodiment, the second PAI process 240 implants Si or Ge at an implant energy level ranging from about 15 KeV to about 50 KeV, a dosage ranging from about $1\times10^{14}$ atoms/$cm^2$ to about $2\times10^{15}$ atoms/$cm^2$, and with a tilt angle of about 0 degree.

A patterned photoresist layer (not shown) may be utilized to define where the second amorphized regions 242 are formed and protect other regions of the semiconductor device 200 from implantation damage. For example, the patterned photoresist layer exposes the source/drain regions, such that the source/drain regions are exposed to the second PAI process 240 (forming the second amorphized regions 242) while the gate structure 220 (and other portions of the semiconductor device 200) are protected from the second PAI process 240. In some alternative embodiments, a patterned hard mask layer (not shown), such as a SiN or SiON layer, is utilized to define the stressor region. The patterned photoresist layer or the patterned hard mask layer may be part of the current manufacturing process (e.g., LDD or source/drain formation), thereby minimizing cost as no additional photoresist layer or hard mask is required for the second PAI process 240.

In the present embodiment, the first PAI process 226 is substantially the same as to the second PAI process 240. In some alternative embodiments, the first PAI process 226 is different than the second PAI process 240.

Figure 8:
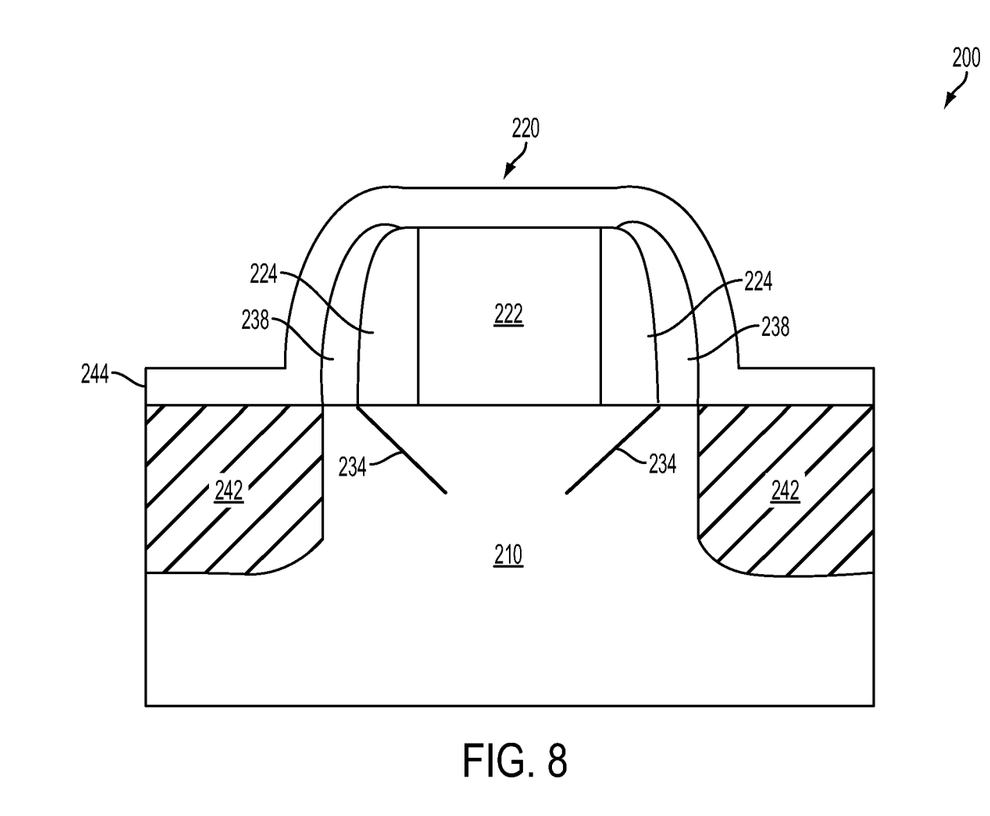

Referring to FIGS. 1 and 8, the method 100 proceeds to step 116 wherein a second stress film 244 is deposited over the substrate 210. The second stress film 244 may be formed by chemical vapor deposition (CVD), physical vapor deposition (PVD), atomic layer deposition (ALD), high density plasma CVD (HDPCVD), plating, other suitable methods, and/or combinations thereof. The second stress film 244 may include a dielectric material, such as silicon nitride, silicon oxide, silicon oxynitride, other suitable materials, and/or combinations thereof. In some embodiments, the second stress film 244 is used to provide tensile stress in a subsequent second annealing process 246 to re-crystallize the second amorphized regions 242.

Figure 9:
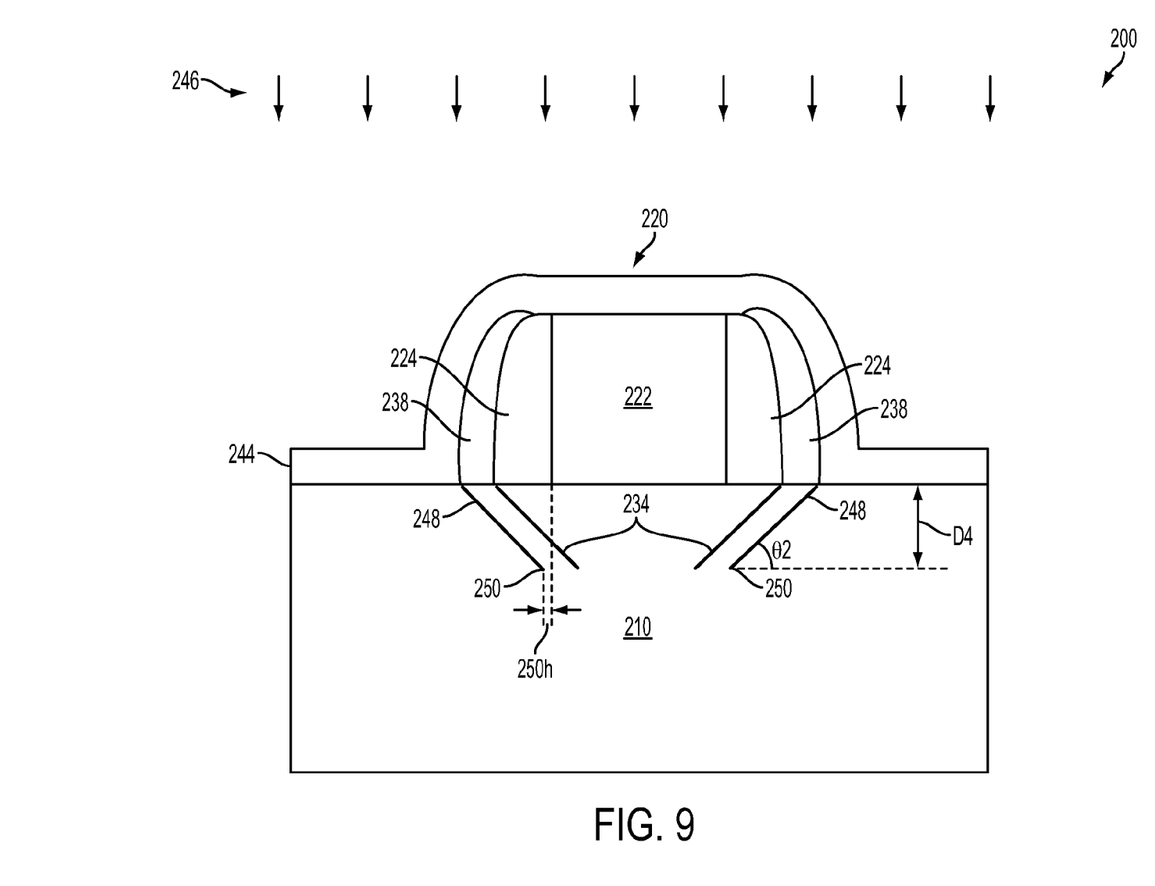

Referring to FIGS. 1 and 9, the method 100 proceeds to step 118 wherein the second annealing process 246 is performed on the substrate 210. The second annealing process 246 causes the second amorphized regions 242 to re-crystallize. In some embodiments, the second annealing process 246 is a rapid thermal annealing (RTA) process, a spike RTA, or a millisecond thermal annealing (MSA) process (for example, a millisecond laser thermal annealing process). In at least one embodiment, the second annealing process 246 includes a RTA process performed at a temperature ranging from about 600° C. to about 750° C., lasting for a period of time ranging from about 10 seconds to about 5 minutes. In an alternative embodiment, the second annealing process 246 includes a spike RTA process performed at a temperature ranging from about 990° C. to about 1050° C., lasting for a period of time ranging from about 0.1 seconds to about 2 seconds. Alternatively, the second annealing process 246 may further include a pre-heat step to minimize (or even eliminate) the end of range (EOR) defects. In some embodiments, the pre-heat step is performed at a temperature ranging from about 400° C. to about 700° C. In some embodiments, the pre-heat step is performed for a period of time ranging from about 10 seconds to about 5 minutes. In the present embodiment, the pre-heat step is performed at a temperature of about 550° C. lasting for about 30 seconds.

In the present embodiment, the first annealing process 232 is substantially the same as to the second annealing process 246. In some alternative embodiments, the first annealing process 232 is different than the second annealing process 246.

During the second annealing process 246, as the second amorphized regions 242 being re-crystallized, second dislocations 248 are formed in the substrate 210. In some embodiments, the second dislocations 248 are formed in the <111> direction. In some embodiments, the <111> direction has an angle θ2, measured with respect to a reference level parallel to a surface of the substrate 210, of about 45 degrees to about 65 degrees. In the present embodiment, the second dislocations 248 have the <111> direction with the angle θ2 of about 55 degrees. In some embodiments, the second dislocations 248 are formed such that they are substantially parallel to the first dislocations 234.

The second dislocations 248 are formed starting at second pinchoff points 250. The second pinchoff points 250 have a depth D4 measured from the upper surface of the substrate 210. In some embodiments, the depth D4 ranges from about 10 nanometers to about 150 nanometers. In the present embodiment, the depth D4 ranges from about 10 nanometers to about 30 nanometers. In the present embodiment, the depth D4 of the second pinchoff points 250 is substantially the same as the depth D2 of the first pinchoff points 236, such that the first dislocations 234 and the second dislocations 248 are substantially at the same level. The second pinchoff points 250 have a horizontal buffer (proximity) 250h measured from an adjacent gate edge of the gate stack 222. The horizontal buffer 250h and the depth D4 are formed according to design specifications and are a function of the second annealing process 246. In some embodiments, the horizontal buffer 250h of the second pinchoff points 254 ranges from about 3 nanometers to about 10 nanometers.

Figure 10:
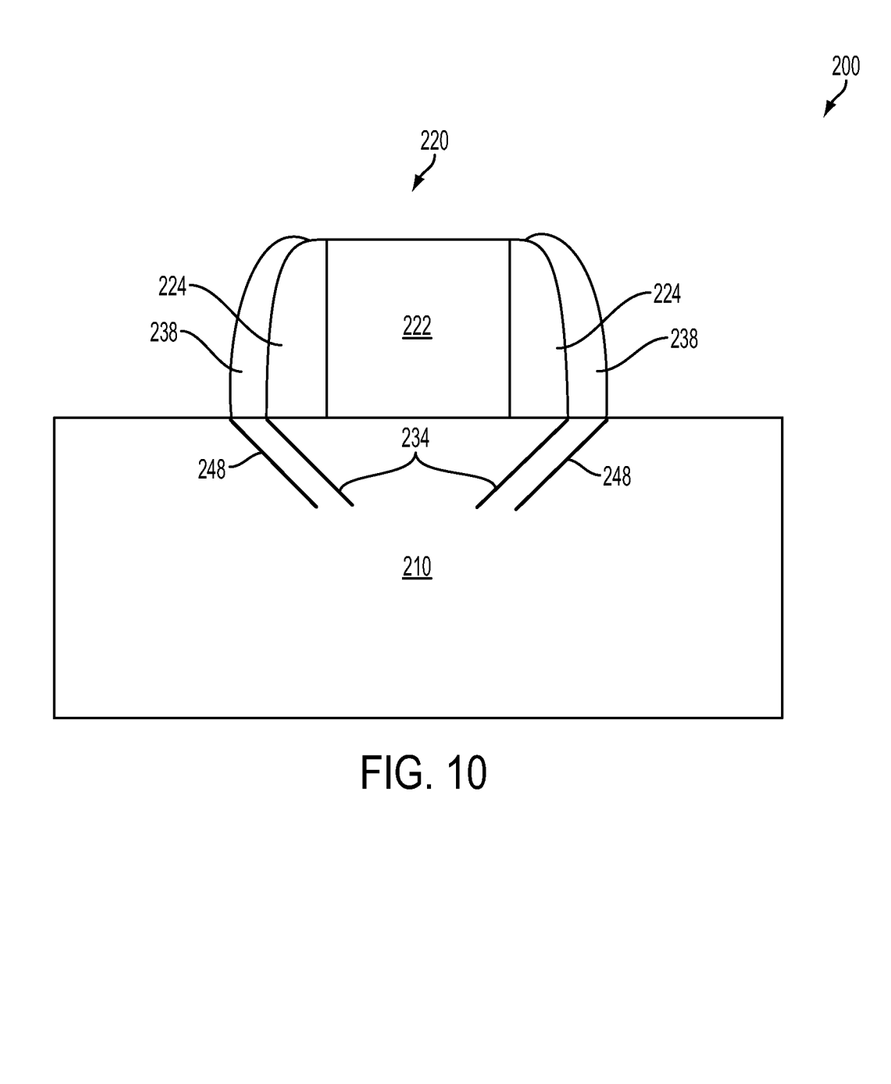

Referring to FIGS. 1 and 10, the method 100 proceeds to step 120 wherein the second stress film 244 is removed from the substrate 210. The second stress film 244 is removed by a wet etching using phosphoric acid or hydrofluoric acid or by a dry etching using suitable etchant. In at least one embodiment, the offset spacers 240 are left after removing the second stress film 244. In an alternative embodiment, the offset spacers 240 are removed after removing the second stress film 244.

A benefit of forming bi-layer dislocations, in accordance with the disclosed embodiments, is that the dislocations formed consistently within the active region (e.g., source/drain), may improve the stress within the channel region. Moreover, the formation of the bi-layer dislocations, in accordance with the disclosed embodiments, have the added benefit of utilizing the patterned photoresist layer or the patterned hard mask layer of current manufacturing process (e.g., LDD or source/drain formation), thereby minimizing cost as no additional photoresist layer or hard mask is required. Thus, the disclosed embodiments provide increased stress level in the channel region to improve carrier mobility without adding significant cost to the manufacturing process and/or device. It is understood that different embodiments may have different advantages, and that no particular advantage is necessarily required of any embodiment. In some embodiments, the pinchoff points of the dislocations are arranged to meet a predetermined stress level for the channel region.

The semiconductor device may undergo further CMOS or MOS technology processing to form various features. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

In an embodiment, the gate stack 222 remains polysilicon in the final device. In another embodiment, a gate replacement process (or gate last process) is performed, where the polysilicon gate stack 222 is replaced with a metal gate. For example, a metal gate may replace the gate stack (i.e., polysilicon gate stack) of the gate structure 220. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a semiconductor device includes a gate structure over a substrate, a source region in the substrate, where the source region is adjacent to the gate structure. Additionally, the semiconductor device includes a drain region in the substrate, where the drain region is adjacent to the gate structure. Moreover, the semiconductor device includes a first dislocation in the substrate between the source region and the drain region. Furthermore, the semiconductor device includes a second dislocation in the substrate between the source region and the drain region, where the second dislocation is substantially parallel to the first dislocation.

In another embodiment, a semiconductor device includes a gate stack over a substrate, gate spacers over the substrate where the gate spacers adjoin sidewalls of the gate stack and each gate spacer of the gate spacers has an outer sidewall. Additionally, the semiconductor device includes offset spacers over the substrate, where each offset spacer of the offset spacers adjoins the outer sidewall of a corresponding gate spacer. Moreover, the semiconductor device includes a first dislocation in the substrate under the gate stack, the gate spacers, and the offset spacers. Furthermore, the semiconductor device includes a second dislocation in the substrate under the gate stack, the gate spacers, and the offset spacers, where the second dislocation is substantially parallel to the first dislocation.

In still another embodiment, a semiconductor device includes a semiconductor substrate, a gate structure over a channel region of the semiconductor substrate. Additionally, the semiconductor device includes a first dislocation in the semiconductor substrate having a first depth measured from an upper surface of the semiconductor substrate. Furthermore, the semiconductor device includes a second dislocation in the semiconductor substrate having a second depth measured from the upper surface of the semiconductor substrate, where the second dislocation is parallel to the first dislocation, and the second depth is the same as the first depth.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate structure over a substrate;
a source region in the substrate, wherein the source region is adjacent to the gate structure;
a drain region in the substrate, wherein the drain region is adjacent to the gate structure;
a first dislocation in the substrate between the source region and the drain region;
a second dislocation in the substrate between the source region and the drain region, wherein the second dislocation is substantially parallel to the first dislocation, wherein at least one of the first dislocation or the second dislocation is outside the source region and the drain region; and
a stress film over the gate structure.

2. The semiconductor device of claim 1, wherein the gate structure comprises:
a gate stack over the substrate; and
gate spacers adjoining sidewalls of the gate stack.

3. The semiconductor device of claim 2, further comprising offset spacers adjoining sidewalls of the gate spacers.

4. The semiconductor device of claim 2, wherein the gate spacers have a thickness ranging from 5 nm to 15 nm.

5. The semiconductor device of claim 1, wherein the stress film comprises at least one of silicon nitride, silicon oxide, or silicon oxynitride.

6. The semiconductor device of claim 1, wherein the first dislocation and the second dislocation are each formed along a <111> direction of the substrate having an angle, measured with respect to a reference level parallel to the upper surface of the substrate, ranging from 45 degrees to 65 degrees.

7. The semiconductor device of claim 1, wherein a first depth of the first dislocation and a second depth of the second dislocation are substantially equal.

8. A semiconductor device, comprising:
a gate stack over a substrate;
gate spacers over the substrate, the gate spacers adjoining sidewalls of the gate stack, each gate spacer of the gate spacers having an outer sidewall;
offset spacers over the substrate, each offset spacer of the offset spacers adjoining the outer sidewall of a corresponding gate spacer;
a first dislocation in the substrate under the gate stack, the gate spacers, and the offset spacers; and
a second dislocation in the substrate under the gate stack, the gate spacers, and the offset spacers, wherein the second dislocation is substantially parallel to the first dislocation.

9. The semiconductor device of claim 8, wherein a first depth of the first dislocation and a second depth of the second dislocation are substantially equal.

10. The semiconductor device of claim 9, wherein each of the first depth and the second depth range from 10 nanometers to 150 nanometers.

11. The semiconductor device of claim 8, further comprising a stress film over the gate structure.

12. The semiconductor device of claim 11, wherein the stress film comprises at least one of silicon nitride, silicon oxide, or silicon oxynitride.

13. The semiconductor device of claim 8, wherein the gate stack comprises polysilicon.

14. The semiconductor device of claim 8, wherein the gate spacers have a thickness ranging from 5 nm to 15 nm.

15. A semiconductor device, comprising:
a semiconductor substrate;
a gate structure over a channel region of the semiconductor substrate;
a first dislocation in the semiconductor substrate having a first depth measured from an upper surface of the semiconductor substrate; and
a second dislocation in the semiconductor substrate having a second depth measured from the upper surface of the semiconductor substrate, wherein the second dislocation is parallel to the first dislocation, and the second depth is the same as the first depth.

16. The semiconductor device of claim 15, wherein the first dislocation and the second dislocation are each formed along a <111> direction of the semiconductor substrate having an angle, measured with respect to a reference level parallel to the upper surface of the semiconductor substrate, ranging from 45 degrees to 65 degrees.

17. The semiconductor device of claim 15, wherein each of the first depth and the second depth range from 10 nanometers to 150 nanometers.

18. The semiconductor device of claim 15, wherein the gate structure comprises:
a gate stack over the substrate; and
gate spacers adjoining sidewalls of the gate stack.

19. The semiconductor device of claim 15, further comprising a stress film over the gate structure.

20. The semiconductor device of claim 19, wherein the stress film comprises at least one of silicon nitride, silicon oxide, or silicon oxynitride.

* * * * *